United States Patent [19]

Sumi et al.

[11] Patent Number: 5,010,212
[45] Date of Patent: Apr. 23, 1991

[54] RESIN COATED ELECTRIC CIRCUIT BOARD DEVICE

[75] Inventors: Chiaki Sumi; Wataru Kuwayama, both of Aichi, Japan

[73] Assignee: Aisin Seiki K.K., Aichi, Japan

[21] Appl. No.: 357,929

[22] Filed: May 30, 1989

[30] Foreign Application Priority Data

May 31, 1988 [JP] Japan .................. 63-134917

[51] Int. Cl.⁵ .................................................. H05K 1/18
[52] U.S. Cl. ...................................... 174/52.2; 29/841; 361/400
[58] Field of Search ............... 174/52.2, 260; 361/400; 29/841

[56] References Cited

U.S. PATENT DOCUMENTS

| | | | |
|---|---|---|---|
| 3,335,327 | 8/1967 | Damon et al. | 174/260 X |
| 3,383,565 | 5/1968 | Gritton | 174/52.2 X |
| 3,991,347 | 11/1976 | Hollyday | 174/260 X |
| 4,143,456 | 3/1979 | Inoue | 174/52.2 X |
| 4,483,067 | 11/1984 | Parmentier | 174/52.2 X |

FOREIGN PATENT DOCUMENTS 2229322  1/1974  Fed. Rep. of Germany ..... 174/52.2

Primary Examiner—Leo P. Picard
Assistant Examiner—David A. Tone
Attorney, Agent, or Firm—Sughrue, Mion, Zinn, Macpeak & Seas

[57] ABSTRACT

A printed circuit board having electrical components connected thereto in spaced relation is coated with a resin material by immersion in a container of resin material. The flow of resin between the electrical devices and the circuit board is facilitated by the provision of holes through the circuit board in alignment with each electrical component so that the formation of blowholes is prevented.

2 Claims, 1 Drawing Sheet

RESIN COATED ELECTRIC CIRCUIT BOARD DEVICE

BACKGROUND OF THE INVENTION

The present invention relates generally to an electronic circuit board device. More particularly, the present invention is concerned with a resin coated electric circuit board device.

In a manufacturing process of an electric circuit board device, several basic devices are arranged on the surface of a base plate. The electric circuit board device comprises, for example, resistors, condensers, relays, integrated circuits (IC) or other electric devices. To provide the electric circuit board device with reliability, a coating of resin material is applied to the surface of the base plate. The resin coating is prepared for the electric circuit board device as a final manufacturing process. A gap is provided between the surface of the base plate and the electric devices. In the resin coating process, a blow-hole may occur in the resin material. The blow-hole does not prevent the entry of humidity between the base plate and the devices.

In order to prevent the entry of humidity, one consideration is proposed in Japanese laid-open publication, No. 60(1985)-165789. The characteristic features of the prior art disclosure are as follows:

Step 1: Electric devices are provided on the base plate with solder connections;

Step 2: Coating material is stored in a container having an ultrasonic generator; and Step 3: Ultrasonic vibrations are applied to the coating material so that the coating material spreads uniformly into the gap wherein blow-holes are removed from the gap.

The largest technical defect in this related art is applying the ultrasonic vibration to the electric device. Due to such vibrations, the growth of a crack may be generated on the surface of the base plate or the wiring pattern and the crack may lead to rupture of the device.

SUMMARY OF THE INVENTION

It is an object of this invention to produce a resin material coated electric circuit board device which is uniformly coated by the resin material.

It is another object of this invention to avoid the formation of a blow-hole in the resin material coating the electric devices arranged on the base plate of an electric circuit board device.

It is a further object of this invention to avoid the entry of humidity between the base plate and the electric devices.

It is a still further object of this invention to provide a high rate radiation electric circuit board device.

Other objects, advantages and novel features of the present invention will become apparent from the following detailed description of the invention when considered in conjunction with the accompanying drawings

DETAILED DESCRIPTION OF THE PREFERRED EMBODIMENT

Figure 1:
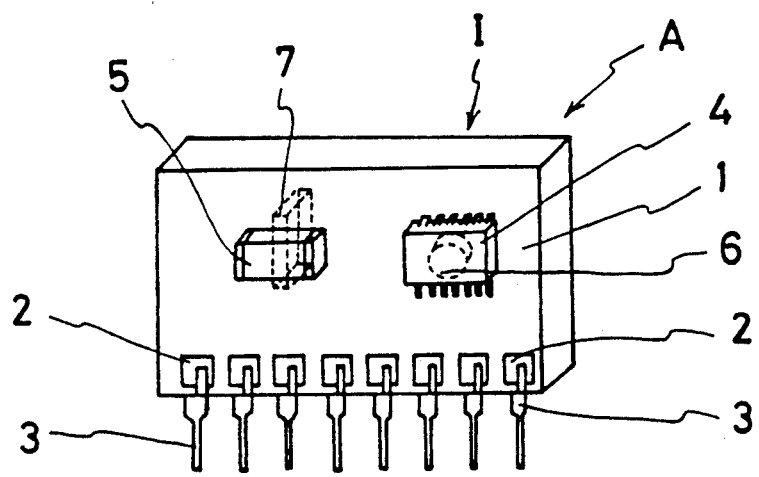
FIG. 1 represents a perspective illustration of an electric circuit board device of the present invention.

Referring to FIG. 1, an electric circuit board device A includes a plurality of electrodes 2 which are arranged on a base plate 1. Likewise, a plurality of terminals 3 are connected to electrodes 2 by solder connections. The base plate 1 is, for example, made of ceramic material. Wiring patterns (not shown in FIG. 1) are printed on the base plate 1 as is well known. The wire pattern is determined based on the characteristic property of the electric circuit board device. An integrated circuit (IC) 4 and a resistor device 5 are arranged on the base plate 1. To produce an electric circuit device, other electric devices are disposed on the base plate 1. Each device is electrically connected with each other via the wire pattern (not shown). An output signal from the electric devices is applied to each electrode 2.

A hole 6 acting as a guide means is formed along the vertical axis of the integrated circuit 4 which is arranged on the base plate 1. A hole 7 is formed adjacent the resistor device 5. A cross section of each hole can be determined arbitrarily. Circular and rectangular cross sections are provided in this embodiment. Each hole has an opening on both sides of the base plate 1. After arrangement of these electric devices, the surface of the electric circuit board device is hardened by a resin material coating as is well known.

Figure 2:
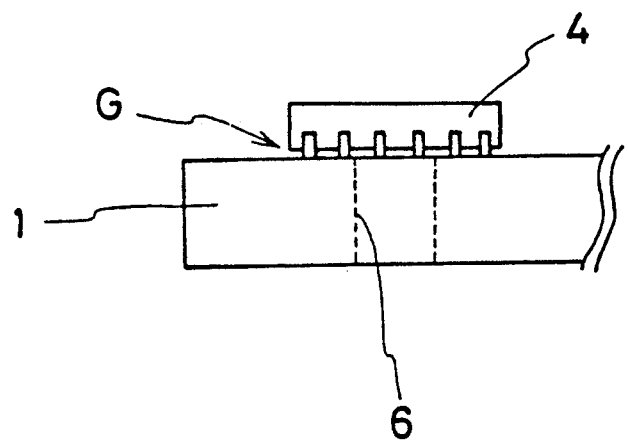
FIG. 2 is a side elevational view in the direction of arrow I in FIG. 1.

FIG. 2 is an elevational view in the direction of the arrow I in FIG. 1. The integrated circuit 4 is positioned above the hole 6. The integrated circuit 4 is electrically connected to the base plate by solder connections. A gap G is defined between the integrated circuit 4 and the base plate 1.

Figure 3:
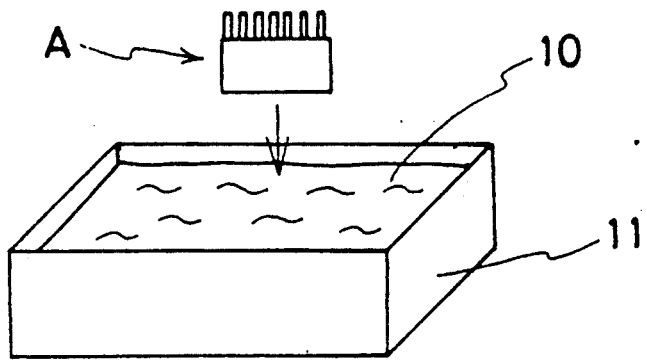
FIG. 3 is a perspective view of the manufacturing process of the present invention.

Referring now to FIG. 3 which shows the resin coating process of this invention, a viscous resin material 10 substantially fills a container 11. The electric circuit board device A is immersed in the viscous resin material 10 for a predetermined time so that the resin material invades each gap G (shown in FIG. 2) which is defined between each electric device and the base plate 1. Thus blow-holes are eliminated and humidity can be excluded from the gap.

The structure of this invention provides an increased surface area for the electric circuit board device A. Therefore, a high rate of radiation can be obtained during the operation of this device.

What is claimed is:

1. A resin coated electric circuit board device comprising:
    a base plate having at least one through hole extending therethrough;
    at least one electrical device mounted on and electrically connected to said base plate in overlying spaced relation to said through hole; and
    resin coating means covering said base plate and each electrical device including said through hole and space between said electrical device and said base plate.

2. A method for coating an electrical circuit board device with resin comprising:
    forming a through hole in a base plate,
    securing at least one electrical device on said base plate in alignment with said through hole and spaced from said base plate and
    immersing said base plate and said electrical device in viscous resin material, whereby said viscous resin material can readily flow through said through hole into the space between the electrical device and the base plate to prevent the formation of voids.

* * * * *